United States Patent
Huang (10) Patent No.: US 10,404,054 B2
(45) Date of Patent: Sep. 3, 2019

(54) UNDER VOLTAGE LOCKOUT CIRCUIT AND DEVICE INTEGRATING WITH THE SAME AND REFERENCE VOLTAGE GENERATING CIRCUIT

(71) Applicant: NUVOTON TECHNOLOGY CORPORATION, Hsinchu (TW)

(72) Inventor: Ming-Hsin Huang, Hsinchu (TW)

(73) Assignee: NUVOTON TECHNOLOGY CORPORATION, Hsinchu (TW)

(*) Notice: Subject to any disclaimer, the term of this patent is extended or adjusted under 35 U.S.C. 154(b) by 242 days.

(21) Appl. No.: 15/651,533

(22) Filed: Jul. 17, 2017

(65) Prior Publication Data

US 2018/0226787 A1 Aug. 9, 2018

(30) Foreign Application Priority Data

Feb. 9, 2017 (TW) .............................. 106104318 A (51) Int. Cl.
| | |
|---|---|
| *H02H 3/24* | (2006.01) |
| *G05F 3/30* | (2006.01) |
| *G06F 1/30* | (2006.01) |
| *H03K 5/24* | (2006.01) |
| *G05F 3/08* | (2006.01) |

(52) U.S. Cl.
CPC .............. *H02H 3/24* (2013.01); *G05F 3/08* (2013.01); *G05F 3/30* (2013.01); *G06F 1/30* (2013.01); *G06F 1/305* (2013.01); *H02H 3/243* (2013.01); *H03K 5/24* (2013.01)

(58) Field of Classification Search
CPC .. H02H 3/24; H02H 3/243; G06F 1/30; G06F 1/305; G05F 3/30
See application file for complete search history.

(56) References Cited

U.S. PATENT DOCUMENTS

| | | | | |
|---|---|---|---|---|
| 6,842,321 | B2* | 1/2005 | Brohlin | H02H 3/243 361/92 |
| 7,075,282 | B2* | 7/2006 | Feng | G05F 3/30 323/313 |
| 7,440,249 | B2* | 10/2008 | Sheng | G01R 19/16552 323/313 |
| 9,898,029 | B2* | 2/2018 | Rasmus | G05F 3/245 |
| 2009/0002037 | A1* | 1/2009 | Ryoo | G06F 1/24 327/143 |

(Continued)

*Primary Examiner* — Ronald W Leja
*Assistant Examiner* — Christopher J Clark
(74) *Attorney, Agent, or Firm* — Muncy, Geissler, Olds & Lowe, P.C.

(57) ABSTRACT

The present disclosure illustrates an under voltage lockout circuit in which a band gap circuit includes two current input terminals for generating a first current associated with band gap, an amplifier includes two inputs terminal coupled to the two current input terminal, and an output terminal configured to output an error-amplified signal, a terminal of a control device is coupled with a voltage source, and a control terminal of the control device receives the error-amplified signal, a voltage divider is coupled between current input terminals and other terminal of the control device, a comparator receiving a lockout voltage and outputting an under voltage lockout signal, a current mirror circuit is coupled to the first input terminal of the comparator and the band gap circuit, and configured to generate a second current mirroring from the first current.

12 Claims, 5 Drawing Sheets

(56) References Cited

U.S. PATENT DOCUMENTS

| | | | |
|---|---|---|---|
| 2009/0309562 A1* | 12/2009 | Lipcsei | G05F 1/56 323/282 |
| 2013/0043949 A1* | 2/2013 | Genest | G05F 3/30 330/257 |
| 2016/0026204 A1* | 1/2016 | de Cremoux | G05F 3/08 323/314 |

* cited by examiner

UNDER VOLTAGE LOCKOUT CIRCUIT AND DEVICE INTEGRATING WITH THE SAME AND REFERENCE VOLTAGE GENERATING CIRCUIT

CROSS-REFERENCE TO RELATED APPLICATION

This application claims the benefit of Taiwan Patent Application No. 106104318, filed on Feb. 9, 2017, in the Taiwan Intellectual Property Office, the disclosure of which is incorporated herein in its entirety by reference.

BACKGROUND OF THE INVENTION

1. Field of the Invention

The present disclosure relates to an under voltage lockout circuit, and more particularly, the present disclosure relates to an under voltage lockout circuit suitable for temperature compensation scheme, and a device integrating with the under voltage lockout circuit and a reference voltage generating circuit.

2. Description of the Related Art

An under voltage lockout circuit and a reference voltage generating circuit are familiar circuits disposed in a chip for providing reference voltages; for example, several reference voltages are defined for stable operation of electronic circuits in the chip, that is, if a voltage provided by a power source is lower than or equal to the defined reference voltage for stable action, the electronic circuit cannot work normally. For this reason, the under voltage lockout (UVLO) circuit is usually disposed in the chip to monitor the voltage of the power source, such as a battery voltage, and if the detected voltage supplied by the power source is lower than the defined reference voltage, the under voltage lockout circuit must trigger other protective electronic circuits to activate and trigger other functional electronic circuits to stop operation, or trigger other functional electronic circuits to store important data. The reference voltage generating circuit is configured to generate the defined reference voltage.

SUMMARY OF THE INVENTION

According to an embodiment, the present disclosure is to provide an under voltage lockout circuit which includes a band gap circuit, an amplifier, a control unit, a voltage divider, a first resistor, a comparator, and a current mirror. The band gap circuit is configured to generate a first current associated with band gap, and includes two current input terminals. The amplifier includes two input terminals electrically coupled to the two current input terminals of the band gap circuit respectively, and is configured to amplify a voltage difference between voltages on the current input terminals. The amplifier includes an output terminal to output an error-amplified signal. The control unit includes a terminal electrically coupled to a power source, a control terminal electrically coupled to the output terminal of the amplifier to receive the error-amplified signal. The voltage divider is electrically coupled between the two current input terminals of the band gap circuit, and other terminal of the control unit. The first resistor includes a terminal electrically coupled to the power source. The comparator includes a first input terminal electrically coupled to other terminal of the first resistor, a second input terminal electrically coupled to the voltage divider to receive a lockout voltage, and an output terminal to output an under voltage lockout signal. The current mirror circuit is electrically coupled to the first input terminal of the comparator and the band gap circuit, and configured to generate a second current flowing through the first resistor. The second current is mirrored from the first current.

Preferably, the band gap circuit includes a first bipolar junction transistor (BJT), a second BJT and a second resistor, and the first BJT includes a base and a collector electrically coupled to each other and to a base of the second BJT, and an emitter electrically coupled to ground, and the collector of the first BJT is one of the two current input terminals, and the second resistor includes a terminal electrically coupled to ground and other terminal electrically coupled to an emitter of the second BJT, and a collector of the second BJT is the other of the two current input terminals.

Preferably, the voltage divider includes a third resistor, a fourth resistor and a fifth resistor, and terminals of the third resistor, the fourth resistor and the fifth resistor are electrically coupled to each other, and other terminal of the third resistor is electrically coupled to the collector of the first BJT, other terminal of the fourth resistor is electrically coupled to the collector of the second BJT, and other terminal of the fifth resistor is electrically coupled to the control unit.

Preferably, the fifth resistor is formed by a plurality of resistor electrically connected in series, and the lockout voltage is a voltage on a terminal of one of the plurality of resistors.

Preferably, the current mirror circuit includes a third BJT including a base electrically coupled to the base of the first BJT, an emitter electrically coupled to ground, and a collector electrically coupled to the other terminal of the first resistor.

Preferably, the under voltage lockout circuit further includes a startup circuit electrically coupled between the voltage divider and the power source.

Preferably, each of the current mirror circuit, the first resistor and the comparator is multiple in number to generate a plurality of different under voltage lockout signals.

According to an embodiment, the present disclosure is to provide a device which integrates with an under voltage lockout circuit and a reference voltage generating circuit, and is configured to generate a reference voltage and an under voltage lockout signal. The device includes a band gap circuit, an amplifier, a control unit, a voltage divider, a first resistor, a comparator, and a current mirror circuit. The band gap circuit is configured to generate a first current associated with band gap, and includes two current input terminals. The amplifier includes two input terminals electrically coupled the two current input terminals of the band gap circuit respectively, and is configured to amplify a voltage difference between voltages on the two current input terminals. The amplifier includes an output terminal to output an error-amplified signal. The control unit includes a terminal electrically coupled a power source, a control terminal electrically coupled to the output terminal of the amplifier to receive the error-amplified signal. The voltage divider is electrically coupled between the two current input terminals of the band gap circuit and other terminal of the control unit. The voltage divider includes an output node, and a voltage on the output node is served as the reference voltage. The first resistor includes a terminal electrically coupled to the power source. The comparator includes a first input terminal electrically coupled to other terminal of the first resistor, a second input terminal electrically coupled to the voltage divider to receive a lockout voltage, and an output terminal to output the under voltage lockout signal. The current mirror circuit is electrically coupled to the first input terminal of the comparator and the band gap circuit, and configured to generate a second current flowing through the first resistor, wherein the second current is mirrored from the first current.

Preferably, the band gap circuit includes a first BJT, a second BJT and a second resistor, and the first BJT includes a base electrically coupled to a base of the second BJT, an emitter electrically coupled to ground and a collector served as one of the two current input terminals, and a terminal of the second resistor is electrically coupled to ground and other terminal electrically coupled to an emitter of the second BJT, and the second BJT includes a collector served as the other of the two current input terminals.

Preferably, the current mirror circuit includes a third BJT including a base electrically coupled to the base of the first BJT, an emitter electrically coupled to ground, and a collector electrically coupled to the other terminal of the first resistor.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

Figure 1:
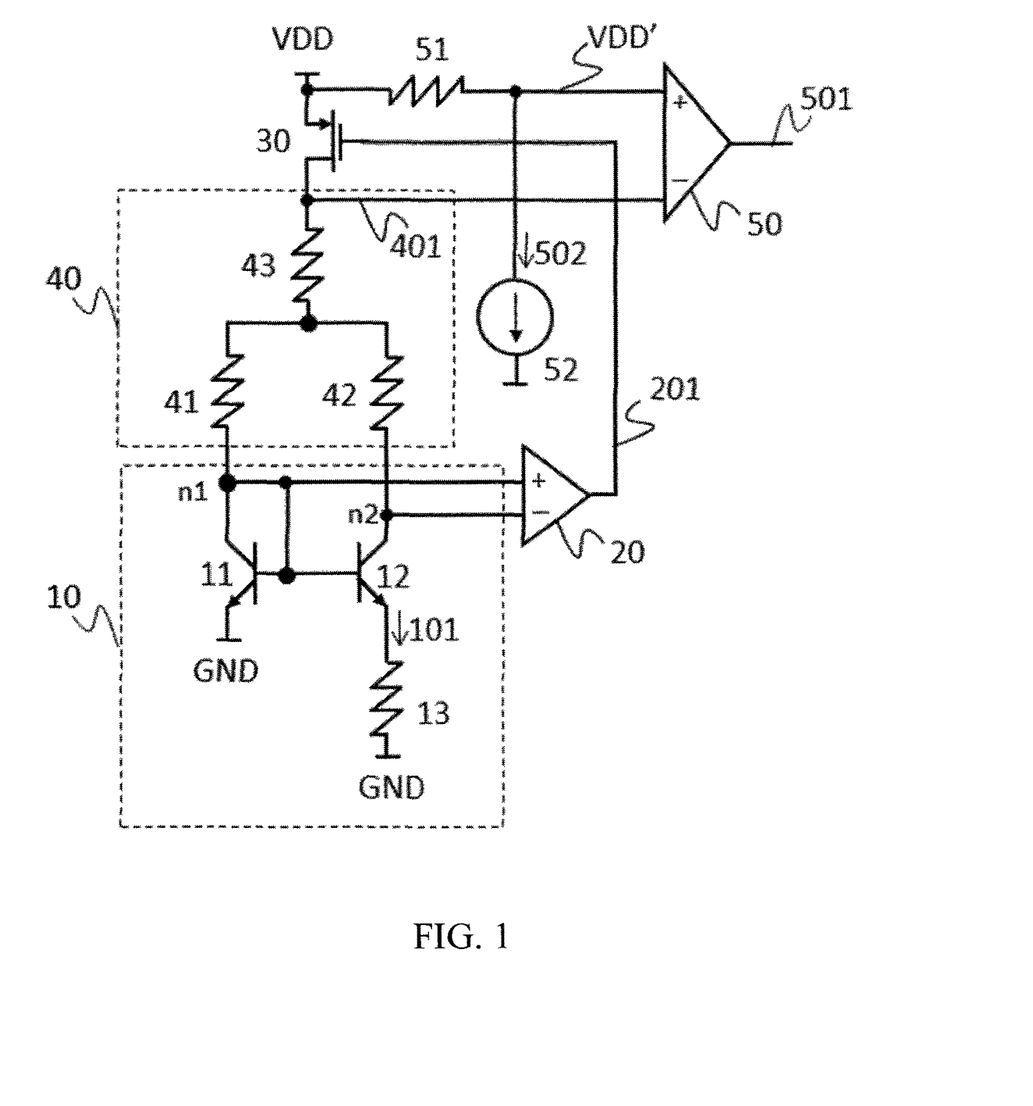
FIG. 1 is a circuit diagram of an embodiment of an under voltage lockout circuit of the present disclosure.
Figure 2A:
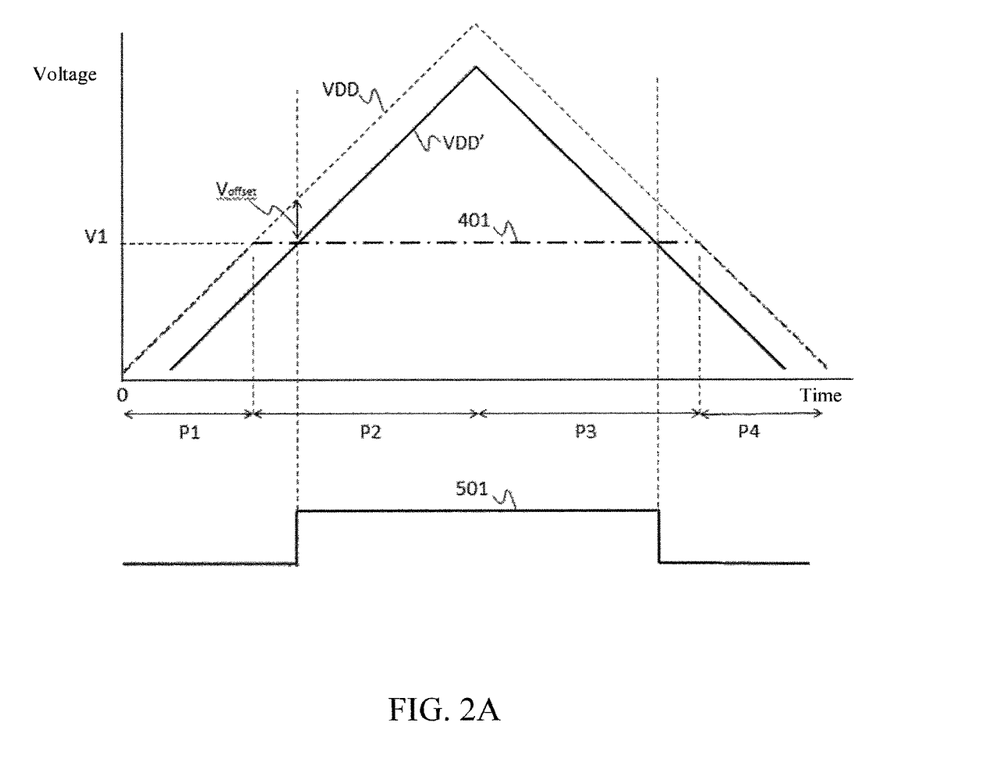
FIG. 2A is a signal waveform diagram of the embodiment shown in FIG. 1.
Figure 2B:
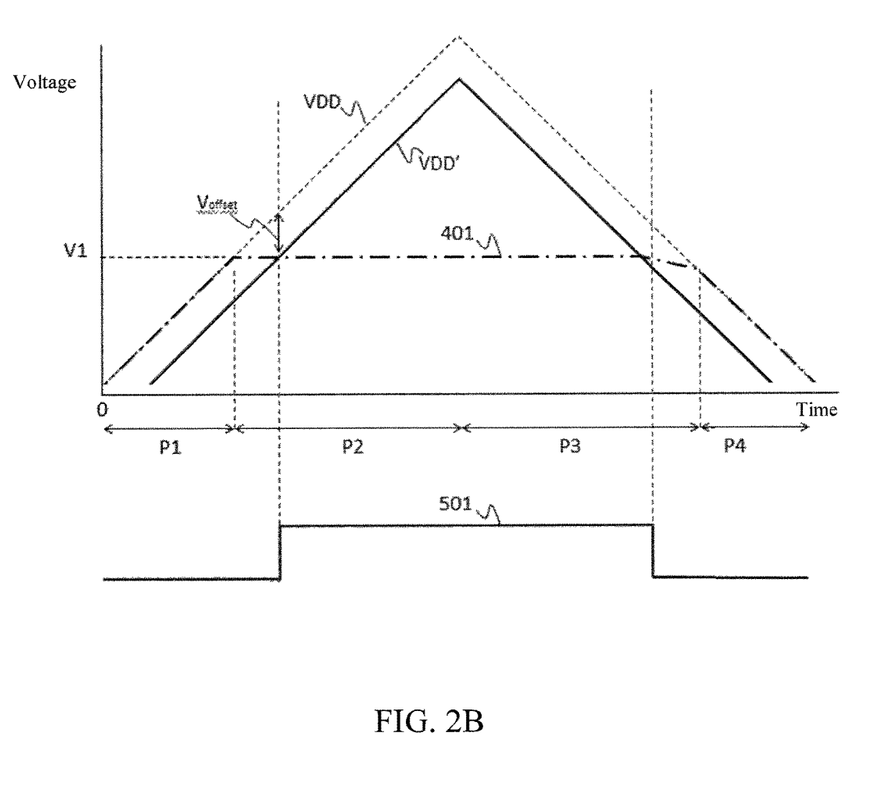
FIG. 2B is another signal waveform diagram of the embodiment shown in FIG. 1.

The following refers to FIGS. 1 and 2, which are circuit diagram and signal waveform diagram of an embodiment of an under voltage lockout circuit of the present disclosure, respectively. In this embodiment, the under voltage lockout circuit may include a band gap circuit 10, an amplifier 20, a control unit 30, a voltage divider 40, a comparator 50, a first resistor 51, and a current mirror circuit 52. The band gap circuit 10 includes two current input terminals n1 and n2, and is configured to generate a first current 101 associated with band gap. The under voltage lockout circuit may be disposed in a chip.

In this embodiment, the band gap circuit 10 may include a first bipolar junction transistor (BJT) 11, a second BJT 12 and a second resistor 13. The first BJT 11 has a base electrically coupled to a collector thereof and electrically coupled to a base of the second BJT 12, and an emitter electrically coupled to ground. The collector of the first BJT 11 is defined as the current input terminal n1. The second resistor 13 has an end electrically coupled to ground and other end electrically coupled to an emitter of the second BJT 12. A collector of the second BJT 12 is defined as the current input terminal n2.

A ratio of areas of the first BJT 11 and the second BJT 12 is designed as 1:K (K is higher than 1), and the area difference causes a voltage difference (VBE11−VBE12) between base-emitter voltages (VBE) of the first BJT 11 and the second BJT 12, and when the voltage difference is applied on the second resistor 13 having resistance R, a first current with a value of (VBE11−VBE12)/R is generated.

The amplifier 20 may include a positive input, a negative input and an output terminal. The positive and negative inputs are electrically coupled to the current input terminals n1 and n2 of the band gap circuit 10, respectively, and amplifier 20 is configured to amplify a voltage difference between the voltages on the current input terminals n1 and n2, and output an error-amplified signal 201 at the output terminal thereof. The control unit 30 may include a terminal electrically coupled to a power source VDD, other terminal electrically coupled to the voltage divider 40, and a control terminal electrically coupled to the output terminal of the amplifier 20 to receive the error-amplified signal 201. In this embodiment, the control unit 30 is a field-effect transistor such as a PMOS transistor; preferably, the PMOS transistor includes a source electrically coupled to the power source VDD, a drain electrically coupled to the voltage divider 40, and a gate electrically coupled to the output terminal of the amplifier 20.

The voltage divider 40 is electrically coupled between the current input terminals n1 and n2 of the band gap circuit 10, and the other terminal of the control unit 30. In this embodiment, the voltage divider 40 may include a third resistor 41, a fourth resistor 42 and a fifth resistor 43. The third resistor 41, the fourth resistor 42 and the fifth resistor 43 has terminals electrically coupled to each other, and other terminal of the third resistor 41 is electrically coupled to the collector of the first BJT 11, other terminal of the fourth resistor 42 is electrically coupled to the collector of the second BJT 12, and other terminal of the fifth resistor 43 is electrically coupled to the control unit 30.

The first resistor 51 includes a terminal electrically coupled to the power source VDD, and the comparator 50 includes a positive input electrically coupled to other terminal of the first resistor 51, a negative input electrically coupled to the voltage divider 40 to receive a lockout voltage 401, and an output terminal configured to output an under voltage lockout signal 501.

The current mirror circuit 52 is electrically coupled to the first input terminal of the comparator 50 and the band gap circuit 10. Almost no current flows into the input terminal of the comparator 50, so the second current 502 generated by the current mirror circuit 52 may almost fully flow through the first resistor 51. The second current 502 is mirrored from the first current 101.

The following illustrates operation process of the embodiment with reference to FIG. 2A.

After the power source VDD is activated, the voltage supplied by the power source VDD starts to rise during period P1. The base and the collector of the first BJT are electrically coupled to each other, so the voltage on the current input terminal n1 is equal to the base-emitter voltage VBE11 of the first BJT 11. The emitter of the second BJT 12 is electrically coupled second resistor 13, so the voltage on the current input terminal n2 is slightly higher than that on the current input terminal n1 and the amplifier 20 outputs the error-amplified signal 201 with negative voltage during the period P1. As a result, the control unit 30 enters a conductive status, and the lockout voltage 401 is almost equal to voltage of the power source VDD; as shown in FIG. 2A, curves of the lockout voltage 401 and the voltage of power source VDD are substantially overlapped.

While the voltage of the power source VDD continuously rises, the currents flowing into the collectors of the first BJT 11 and the second BJT 12 slightly increase, which causes the base-emitter voltages VBE11 and VBE12 also increase slightly; however, the emitter of the second BJT 12 is electrically coupled to the second resistor 13, so the increasing rate of the voltage on the current input terminal n2 is lower than that of the voltage on the current input terminal n1, and the voltage on the current input terminal n1 will be higher than that on the current input terminal n2 after the voltage of the power source VDD continuously rises for a while.

After the voltage on the current input terminal n1 is higher than that on the current input terminal n2, the amplifier 20 outputs the error-amplified signal 201 with positive voltage, so that the control unit 30 enters a linear state and the lockout voltage 401 is maintained in V1 voltage while the voltage of the power source VDD continuously rises; as shown in FIG. 2A, during period P2, the curves of the lockout voltage 401 and the voltage of power source VDD are separated from each other.

During the operation process of this embodiment, the second current 502 is flowed through the first resistor 51 to generate a voltage $V_{offset}$ across the first resistor 51, and the voltage VDD' on the positive input of the comparator 50 is equal to (VDD−$V_{offset}$), as shown in FIG. 2A, there is a fixed voltage difference $V_{offset}$ between the curves of voltage of the power source VDD and voltage VDD'. When the voltage VDD' is higher than V, the comparator 50 changes the voltage level of the under voltage lockout signal 501 from low voltage level to high voltage level.

The circuit designer can adjust the lockout voltage V1 according to property of the control unit 30, the resistance value of the resistor of the voltage divider 40 or the property of the transistor of the band gap circuit 10. The voltage value V1 may be defined as a voltage for stable operations of the other elements, that is, when the voltage of the power source VDD reaches the voltage value V1, other elements in the chip may start to operate.

As shown in FIG. 2A, if the voltage of the power source VDD starts to drop during period P3, when the voltage VDD' on the positive input of the comparator 50 is lower than the voltage value V1, the comparator 50 changes the voltage level of the under voltage lockout signal 501 from high voltage level to low voltage level, and the change can be used to notice other elements of the chip to store important data and get ready to stop operation because of the voltage of the power source being too low.

The voltages on the current input terminals n1 and n2 are also dropped and the dropping rate of the voltage of the current input terminal n1 is higher than that of the current input terminal n2, if the voltage of the current input terminal n1 is lower than that of the current input terminal n2, such as in period P4, the amplifier 20 outputs the error-amplified signal 201 having a negative voltage level and the control unit 30 enters the conductive status, so that the lockout voltage 401 is almost equal to the voltage VDD during period P4 and the comparator 50 does not change the output state thereof.

It should be noted that the voltage level of the under voltage lockout signal 501 shown in FIG. 2A is merely for exemplary illustration, and the present disclosure is not limited thereto; the circuit designer can change the voltage level of the under voltage lockout signal 501 upon demand, for example, the low voltage level shown in FIG. 2A can be changed to high voltage level, and the high voltage level of FIG. 2A can be changed to low voltage level. For illustrative convenience, FIG. 2A shows an ideal signal waveform diagram, but the present disclosure is not limited thereto. In consideration of actual property of the elements, such as hysteresis effect of the comparator and the actual property of the control unit 30, the signal waveform diagram may be like that shown in FIG. 2B.

The second current 502 is mirrored from the first current 101 and the elements of the circuit are manufactured by the same manufacturing process, so temperature properties of the second current 502 and the first current 101 may be the same, which achieve the temperature compensation effect on the comparison voltage on the input terminals of the comparator 501. As a result, the under voltage lockout circuit of the present disclosure may not be affected by change of temperature. Upon demand, the under voltage lockout circuit of the present disclosure may include a startup circuit, and the configuration of the voltage divider 40 may be changed. In other embodiment, an under voltage lockout signal 501 configured to provide different lockout voltages may also be implemented. The following describes detailed illustration for other embodiment.

Figure 3:
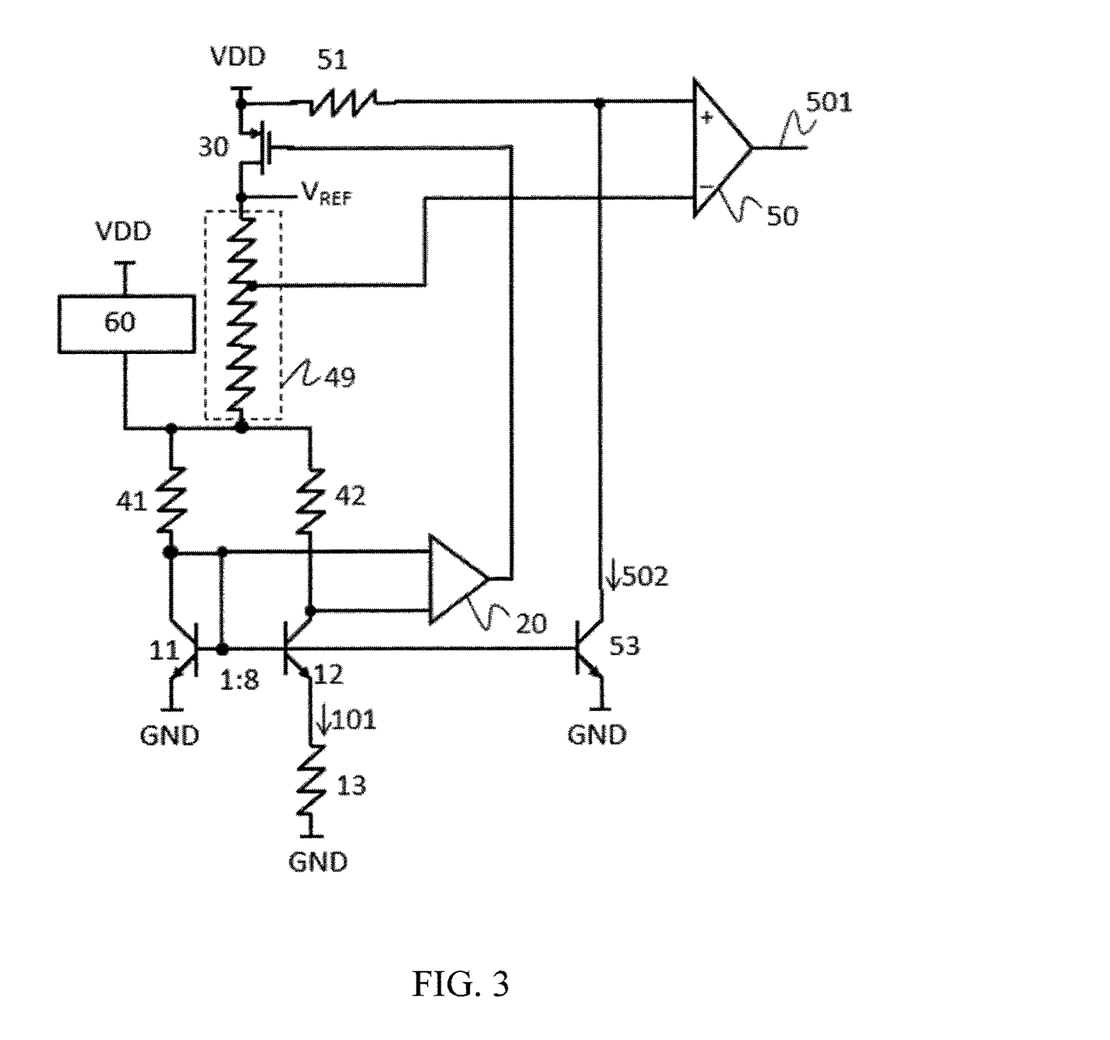
FIG. 3 is a circuit diagram of other embodiment of the under voltage lockout circuit of the present disclosure.

The following refers to FIG. 3, which is a circuit diagram of other embodiment of the under voltage lockout circuit of the present disclosure. The difference between this embodiment and previous embodiment is that the fifth resistor 43 of the voltage divider 40 is implemented by a series resistor circuit 49 which includes a plurality of resistor connected in series. A voltage on a terminal of one of the plurality of resistors is served as the lockout voltage 401. In this embodiment, the lockout voltage 401 is a divided voltage of the voltage VREF on other terminal of the control unit 30; similarly, when the voltage of the power source VDD is higher than the voltage VREF, the lockout voltage 401 and the voltage VREF may be maintained steadily, and the voltage VREF may be serve as the reference voltage for other elements of the chip, and the lockout voltage 401 may be used for detection of low voltage.

The current mirror circuit 52 includes a third BJT 53 which includes a base electrically coupled to the base of the first BJT 11, an emitter electrically coupled to ground, and a collector electrically coupled to the other terminal of the first resistor 51.

In this embodiment, a startup circuit 60 is electrically connected between the voltage divider 40 and the power source VDD. When the power source just starts to provide voltage, the voltage of the power source is too low to ensure operation of the elements in the circuit, and at this time, the startup circuit 60 can provide a default voltage to ensure the operation of the element in the circuit until the voltage of the power source VDD rises to a high enough voltage.

According to the embodiments, the present disclosure further provides a device integrating with the under voltage lockout circuit and a reference voltage generating circuit, that is, this device is able to generate the reference voltage and detect the low voltage at the same time. The other terminal of the control unit 30 can be served as an output node, and the voltage VREF on the output node can be served as the reference voltage for other circuit.

Figure 4:
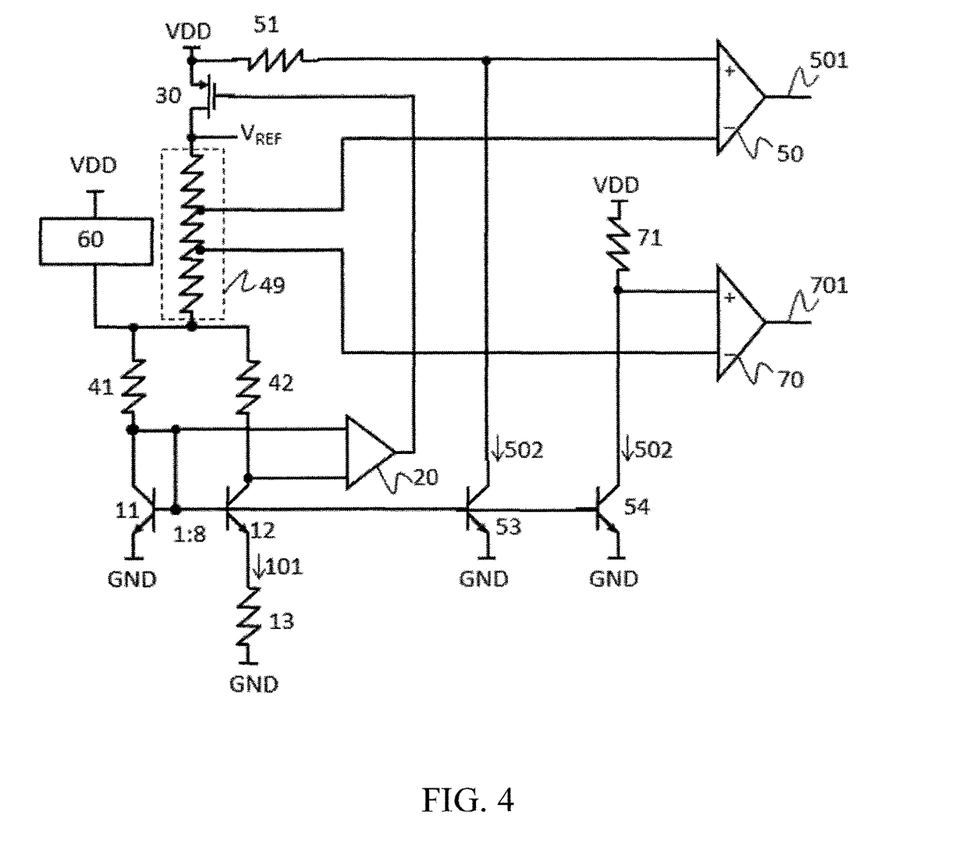
FIG. 4 is a circuit diagram of alternative embodiment of the under voltage lockout circuit of the present disclosure.

The following refers to FIG. 4, which is a circuit diagram of alternative embodiment of the under voltage lockout circuit of the present disclosure. The difference between this embodiment and previous embodiments is that the under voltage lockout circuit of this embodiment may include a first resistor 71, a comparator 70 and a third BJT 54, and is configured to generate a plurality of different under voltage lockout signals 501 and 701 for different voltage detection of different elements in the chip. The first resistor 71 has a terminal electrically coupled to the power source VDD, and other terminal electrically coupled to the positive input of the comparator 70.

The comparator 70 has a negative input electrically coupled to a terminal of a resistor of the serial resistor circuit 49, and the negative inputs of the comparator 50 and the comparator 70 respectively receive different voltages. The third BJT 54 has a base electrically coupled to the base of the first BJT 11, an emitter electrically coupled to ground and a collector electrically coupled to the other terminal of the first resistor 51. The under voltage lockout signal 701 is generated by the same manner as that of the under voltage lockout signal 501, but has different lockout voltage for determining level change, so detailed description is not repeated.

The present disclosure disclosed herein has been described by means of specific embodiments. However, numerous modifications, variations and enhancements can be made thereto by those skilled in the art without departing from the spirit and scope of the invention set forth in the claims.

What is claimed is:

1. An under voltage lockout circuit, comprising:
  a band gap circuit configured to generate a first current associated with band gap, and comprising two current input terminals;
  an amplifier comprising two input terminals electrically coupled to the two current input terminals of the band gap circuit respectively, and configured to amplify a voltage difference between voltages on the current input terminals, and the amplifier comprising an output terminal to output an error-amplified signal;
  a control unit comprising a terminal electrically coupled to a power source, a control terminal electrically coupled to the output terminal of the amplifier to receive the error-amplified signal;
  a voltage divider electrically coupled between the two current input terminals of the band gap circuit, and other terminal of the control unit;
  a first resistor comprising a terminal electrically coupled to the power source;
  a comparator comprising a first input terminal electrically coupled to other terminal of the first resistor, a second input terminal electrically coupled to the voltage divider to receive a lockout voltage, and an output terminal to output an under voltage lockout signal; and
  a current mirror circuit electrically coupled to the first input terminal of the comparator and the band gap circuit, and configured to generate a second current flowing through the first resistor, and wherein the second current is mirrored from the first current.

2. The under voltage lockout circuit according to claim 1, wherein the band gap circuit comprises a first bipolar junction transistor (BJT), a second BJT and a second resistor, and the first BJT comprises a base and a collector electrically coupled to each other and to a base of the second BJT, and an emitter electrically coupled to ground, and the collector of the first BJT is one of the two current input terminals, and the second resistor comprises a terminal electrically coupled to ground and other terminal electrically coupled to an emitter of the second BJT, and a collector of the second BJT is the other of the two current input terminals.

3. The under voltage lockout circuit according to claim 2, wherein the voltage divider comprises a third resistor, a fourth resistor and a fifth resistor, and terminals of the third resistor, the fourth resistor and the fifth resistor are electrically coupled to each other, and other terminal of the third resistor is electrically coupled to the collector of the first BJT, other terminal of the fourth resistor is electrically coupled to the collector of the second BJT, and other terminal of the fifth resistor is electrically coupled to the control unit.

4. The under voltage lockout circuit according to claim 3, wherein the fifth resistor is formed by a plurality of resistor electrically connected in series, and the lockout voltage is a voltage on a terminal of one of the plurality of resistors.

5. The under voltage lockout circuit according to claim 2, wherein the current mirror circuit comprises a third BJT comprising a base electrically coupled to the base of the first BJT, an emitter electrically coupled to ground, and a collector electrically coupled to the other terminal of the first resistor.

6. The under voltage lockout circuit according to claim 1, further comprising a startup circuit electrically coupled between the voltage divider and the power source.

7. The under voltage lockout circuit according to claim 1, wherein each of the current mirror circuit, the first resistor and the comparator is multiple in number to generate a plurality of different under voltage lockout signals.

8. A device integrating with an under voltage lockout circuit and a reference voltage generating circuit, and configured to generate a reference voltage and an under voltage lockout signal, and comprising:
  a band gap circuit configured to generate a first current associated with band gap, and comprising two current input terminals;
  an amplifier comprising two input terminals electrically coupled to the two current input terminals of the band gap circuit respectively, and configured to amplify a voltage difference between voltages on the two current input terminals, and the amplifier comprising an output terminal to output an error-amplified signal;
  a control unit comprising a terminal electrically coupled to a power source, a control terminal electrically coupled to the output terminal of the amplifier to receive the error-amplified signal;

a voltage divider electrically coupled between the two current input terminals of the band gap circuit and other terminal of the control unit, wherein the voltage divider comprises an output node, and a voltage on the output node is served as the reference voltage;

a first resistor comprising a terminal electrically coupled to the power source;

a comparator comprising a first input terminal electrically coupled to other terminal of the first resistor, a second input terminal electrically coupled to the voltage divider to receive a lockout voltage, and an output terminal to output the under voltage lockout signal; and a current mirror circuit electrically coupled to the first input terminal of the comparator and the band gap circuit, and configured to generate a second current flowing through the first resistor, wherein the second current is mirrored from the first current.

9. The device according to claim 8, wherein the band gap circuit comprises a first BJT, a second BJT and a second resistor, and the first BJT comprises a base electrically coupled to a base of the second BJT, an emitter electrically coupled to ground and a collector served as one of the two current input terminals, and a terminal of the second resistor is electrically coupled to ground and other terminal electrically coupled to an emitter of the second BJT, and the second BJT comprises a collector served as the other of the two current input terminals.

10. The device according to claim 9, wherein the current mirror circuit comprises a third BJT which comprises a base electrically coupled to the base of the first BJT, an emitter electrically coupled to ground, and a collector electrically coupled to the other terminal of the first resistor.

11. The under voltage lockout circuit according to claim 9, wherein the voltage divider comprises a third resistor, a fourth resistor and a fifth resistor, and terminals of the third resistor, the fourth resistor and the fifth resistor are electrically coupled to each other, and other terminal of the third resistor is electrically coupled to the collector of the first BJT, other terminal of the fourth resistor is electrically coupled to the collector of the second BJT, and other terminal of the fifth resistor is electrically coupled to the control unit.

12. The under voltage lockout circuit according to claim 11, wherein the fifth resistor is formed by a plurality of resistor electrically connected in series, and the lockout voltage is a voltage on a terminal of one of the plurality of resistors.

* * * * *